(12) United States Patent
Nishiyama et al.

(10) Patent No.: US 7,052,971 B2
(45) Date of Patent: May 30, 2006

(54) METHOD FOR MANUFACTURING SEMICONDUCTOR DEVICE

(75) Inventors: Yukio Nishiyama, Yokohama (JP); Hirotaka Ogihara, Saitama (JP); Rempei Nakata, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/193,143

(22) Filed: Jul. 12, 2002

(65) Prior Publication Data

US 2003/0022522 A1  Jan. 30, 2003

(30) Foreign Application Priority Data

Jul. 13, 2001  (JP)  ............................. 2001-213689

(51) Int. Cl.
*H01L 21/762* (2006.01)

(52) U.S. Cl. ..................... 438/437; 438/624; 438/763

(58) Field of Classification Search ................ 438/437, 438/702, 624, 763, FOR. 227, FOR. 355
See application file for complete search history.

(56) References Cited

U.S. PATENT DOCUMENTS

| | | | |
|---|---|---|---|
| 6,024,106 A * | 2/2000 | Yang et al. ................... 134/1.3 |
| 6,335,287 B1 * | 1/2002 | Hwang et al. ............... 438/692 |
| 6,335,288 B1 * | 1/2002 | Kwan et al. ................. 438/694 |
| 6,380,047 B1 * | 4/2002 | Bandyopadhyay et al. . 438/427 |
| 6,391,781 B1 * | 5/2002 | Ozawa et al. ................ 438/692 |
| 6,395,150 B1 * | 5/2002 | Van Cleemput et al. ....... 204/192.37 |
| 6,417,073 B1 * | 7/2002 | Watanabe .................... 438/424 |
| 6,448,150 B1 * | 9/2002 | Tsai et al. .................... 438/427 |
| 6,740,601 B1 * | 5/2004 | Tan et al. .................... 438/771 |
| 2002/0055271 A1 * | 5/2002 | Lee et al. .................... 438/782 |
| 2003/0162363 A1 * | 8/2003 | Ji ................................ 438/424 |
| 2004/0126952 A1 * | 7/2004 | Gondhalekar et al. ....... 438/200 |
| 2004/0198019 A1 * | 10/2004 | Yasui et al. |

FOREIGN PATENT DOCUMENTS

| | | |
|---|---|---|
| JP | 59-058837 | 4/1984 |
| JP | 59-225543 | 12/1984 |
| JP | 2000-114362 | 4/2000 |
| JP | 2000-183150 | 6/2000 |
| JP | 2000-294627 | 10/2000 |
| JP | 2000-332099 | 11/2000 |
| JP | 2001-135718 | 5/2001 |
| JP | 2001-244327 | 9/2001 |
| JP | 2003031650 A * | 1/2003 |

OTHER PUBLICATIONS

Derwent Acc No. 2002-596241: Abstract of KR2002017588A.*
Derwent Acc No. 2002-748804: Abstract of KR2002046828A.*
Notification of Reason for Rejection issued by Japanese Patent Office, mailed Sep. 6, 2005, in Japanese Patent Application No. 2001-213689, and English-language translation.

* cited by examiner

*Primary Examiner*—George Fourson
(74) *Attorney, Agent, or Firm*—Finnegan, Henderson, Farabow, Garrett & Dunner, L.L.P.

(57) ABSTRACT

A method for manufacturing a semiconductor device of the present invention includes, forming a first silicon oxide film by HDP-CVD so as to bury a recess portion in a three-dimensional portion formed in a surface region of a semiconductor workpiece to a position lower than an upper surface of the recess portion, and forming a second silicon oxide film by SOG on the first silicon oxide film so as to fill the recess portion.

16 Claims, 12 Drawing Sheets

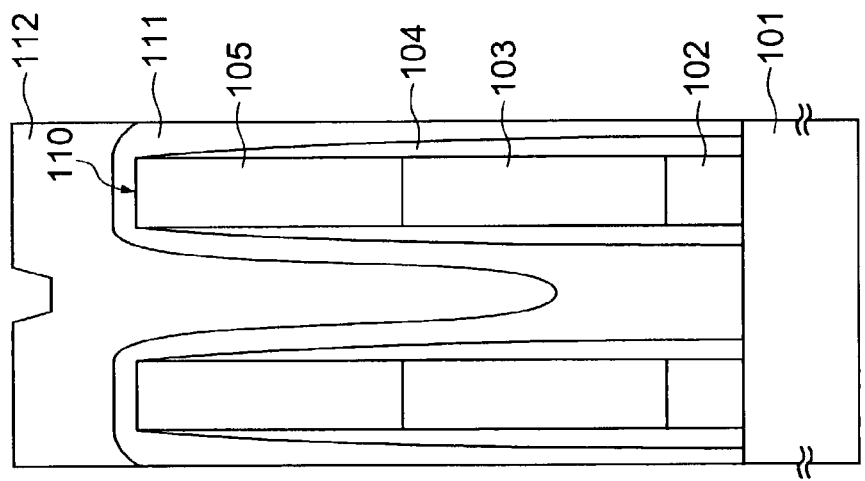
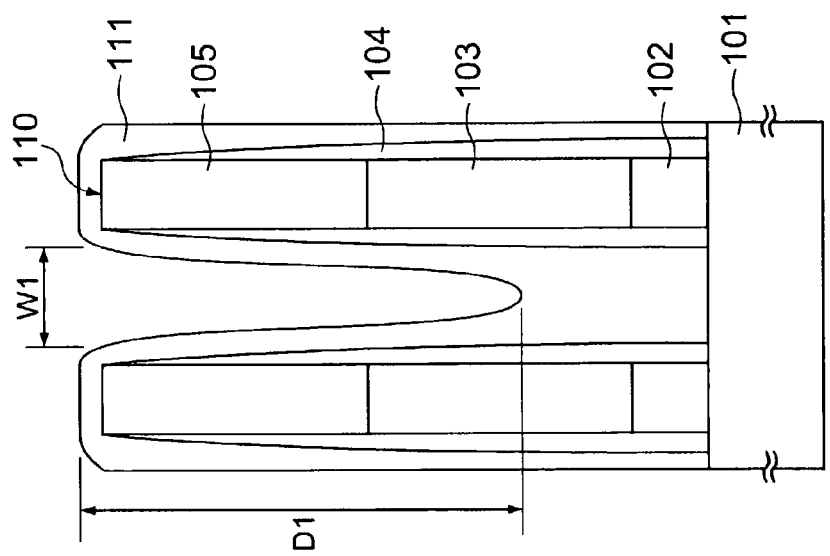
FIG. 10A
FIG. 10B

METHOD FOR MANUFACTURING SEMICONDUCTOR DEVICE

CROSS REFERENCE TO RELATED APPLICATION

This application claims benefit of priority under 35 USC 119 to Japanese Patent Application No. 2001-213689, filed on Jul. 13, 2001, the entire contents of which are incorporated by reference herein.

BACKGROUND OF THE INVENTION

The present invention relates to a method for manufacturing a semiconductor device and, more particularly, to a method of filling, e.g., an element isolation trench or a recess portion for an interconnection or between electrodes with an insulating film.

In a semiconductor device, to electrically isolate elements formed on a substrate, element isolation is used, in which a trench is formed between elements in a surface region of a substrate and filled with an insulating film. This method is called shallow trench isolation (to be referred to as STI hereinafter).

In addition, portions between interconnection layers or between electrodes formed on the substrate as a conductive film pattern must be filled with an interlayer dielectric film.

To fill these recess portions with an insulating film, a silicon oxide film is formed by high density plasma chemical vapor deposition (to be referred to as HDP-CVD hereinafter) or by thermal CVD using $TEOS/O_3$ gas.

However, along with the recent progress in micropatterning of devices, the aspect ratios of recess portions are becoming high. Hence, it is very difficult to fill recess portions without generating any void or seam.

FIGS. 15A to 15H show steps in filling element isolation trenches by a conventional method. As shown in FIG. 15A, a silicon oxide film 1102 is formed on the surface of a semiconductor substrate 1101 by thermal oxidation.

As shown in FIG. 15B, a silicon nitride film 1103 is deposited on the resultant structure. This silicon nitride film 1103 is patterned to obtain a mask for trench formation.

As shown in FIG. 15C, the semiconductor substrate 1101 is etched by, e.g., RIE (Reactive Ion Etching) using the silicon nitride film 1103 as a mask, thereby forming trenches 1105. A silicon oxide film 1104 is formed on the side walls and bottom surfaces of the trenches 1105 by thermal oxidation.

As shown in FIG. 15D, a silicon oxide film 1106 is deposited by HDP-CVD to fill the trenches 1105. In this process of depositing the silicon oxide film 1106, overhangs 1107 are formed. When the silicon oxide film 1106 is further deposited, voids 1108 are formed, as shown in FIG. 15E.

As shown in FIG. 15F, the surface is planarized by CMP (Chemical Mechanical Polishing). The planarization processing is stopped at the silicon nitride film 1103 serving as a stopper.

As shown in FIG. 15G, the silicon nitride film 1103 is removed by etching.

As shown in FIG. 15H, the silicon oxide film 1106 that projects from the surface of the semiconductor substrate 1101 is removed by etching.

Portions (seams) 1109 where the influence of the voids 1108 remains are present on the surface of the resultant silicon oxide film 1106, as shown in FIG. 15H.

As another method of forming a silicon oxide film, Spin On Glass (to be referred to as SOG hereinafter) using a liquid source can also be used. According to this method, the material of a silicon oxide film is melted into a solvent. A forming portion is coated with the liquid, and then, annealing is executed, thereby forming a silicon oxide film.

In this method, however, the film shrinks. When a trench is filled with the film, large stress may occur, or the film may peeled from the inner wall of the trench. Additionally, even when annealing is executed for a film buried in a trench, the film cannot be sufficiently sintered, and an impurity remains in the film. As a consequence, the quality of the resultant film is not satisfactory. This may affect the element isolation resistance or isolation resistance between interconnection layers or between electrodes.

As described above, it is conventionally difficult to fill a trench or a recess portion between interconnection layers or between electrodes with an insulating material while ensuring sufficient electrical isolation resistance without generating any void or seam.

SUMMARY OF THE INVENTION

A method for manufacturing a semiconductor device according to an aspect of the present invention comprises, forming a first silicon oxide film by high density plasma chemical vapor deposition (to be referred to as HDP-CVD hereinafter) as to bury a recess portion in a three-dimensional portion formed in a surface region of a semiconductor workpiece to a position lower than an upper surface of the recess portion, and forming a second silicon oxide film by spin on glass (to be referred to as SOG hereinafter) on the first silicon oxide film so as to fill the recess portion in the surface region of the semiconductor workpiece.

A method for manufacturing a semiconductor device according to anther aspect of the present invention comprises, forming a first silicon oxide film by SOG so as to bury a recess portion in a three-dimensional portion formed in a surface region of a semiconductor workpiece to a position lower than an upper surface of the recess portion, and forming a second silicon oxide film by HDP-CVD on the first silicon oxide film so as to fill the recess portion.

BRIEF DESCRIPTION OF THE DRAWINGS

FIGS. 10A and 10B are longitudinal sectional views showing an element so as to explain steps in manufacturing a semiconductor device according to the fourth embodiment of the present invention;

DETAILED DESCRIPTION OF THE PREFERRED EMBODIMENTS

The embodiments of the present invention will be described below with reference to the accompanying drawings.

(1) FIRST EMBODIMENT

A method for manufacturing a semiconductor device according to the first embodiment of the present invention will be described with reference to FIGS. 1 to 6. This embodiment corresponds to a method wherein an element isolation trench is formed in a surface region of a semiconductor substrate and filled with an insulating film.

Figure 1:
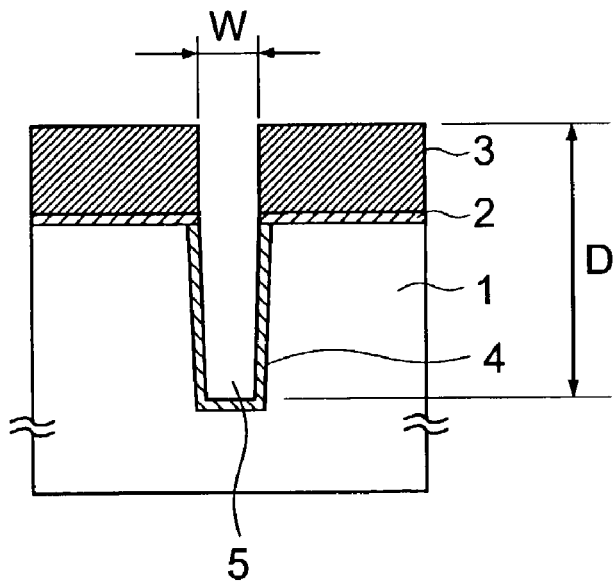
FIG. 1 is a longitudinal sectional view showing an element so as to explain steps in manufacturing a semiconductor device according to the first embodiment of the present invention.
Figure 15A:
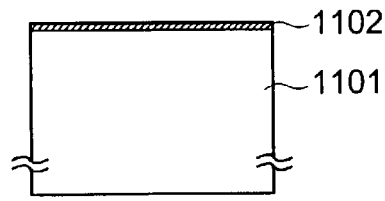
FIGS. 15A to 15H are longitudinal sectional views showing an element so as to explain steps in manufacturing a conventional semiconductor device.
Figure 15B:
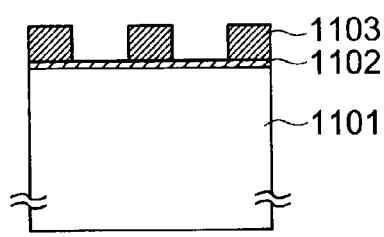
Figure 15C:
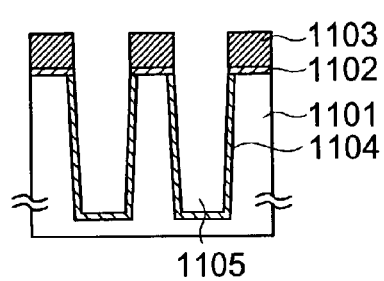
Figure 15D:
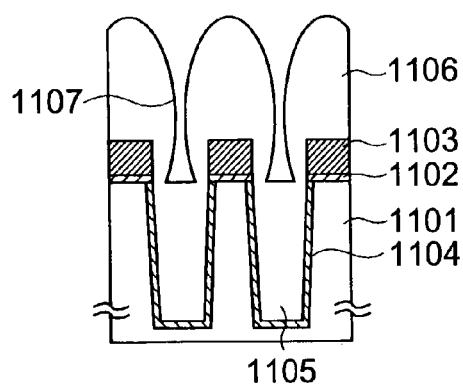
Figure 15E:
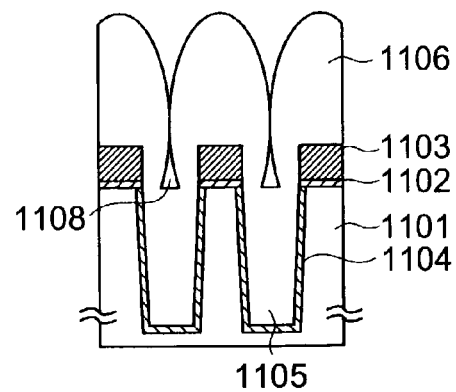

First, an element isolation trench 5 is obtained by the same process as in the conventional manufacturing method described with reference to FIGS. 15A to 15C. More specifically, a silicon oxide film 2 and an about 150-nm thick silicon nitride film 3 are sequentially formed on the surface of a semiconductor substrate 1 and patterned to form a mask for trench formation. The trench 5 is formed by RIE. A silicon oxide film 4 is formed on the side wall and bottom surface of the trench 5. With this process, the element isolation trench 5 shown in FIG. 1 is formed. This trench 5 has, e.g., a depth of about 300 nm and a width of about 100 nm. The aspect ratio of the entire trench including the about 150-nm thick silicon nitride film 3 is about 4.5.

When the trench 5 having such a high aspect ratio is filled with a silicon oxide film by HDP-CVD, as in the prior art, a void is formed.

Figure 2:
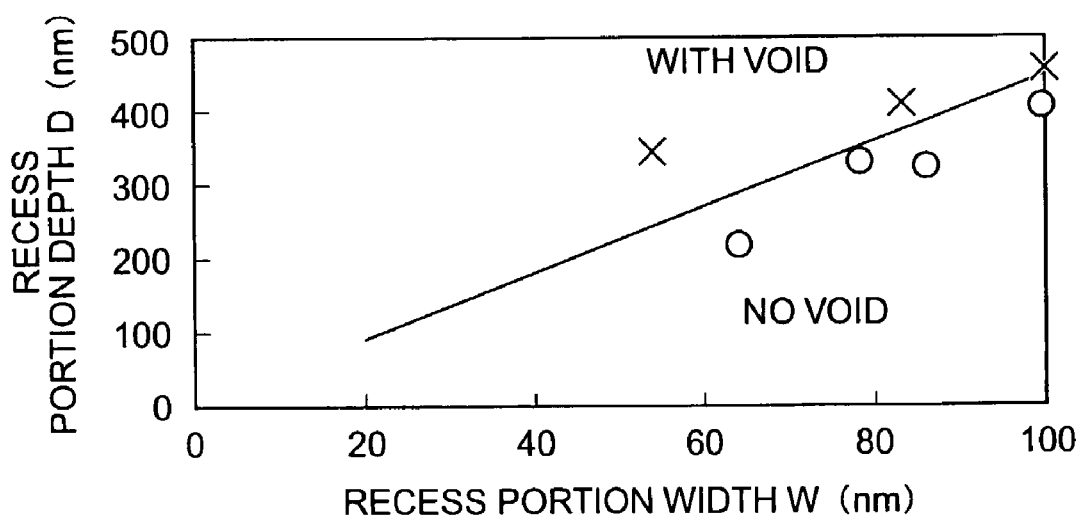
FIG. 2 is a graph showing the relationship between the depth and width of a recess portion and the presence/absence of a void.

Let D (nm) be the depth of a recess portion (in this embodiment, the thickness of the silicon nitride film 3+ the depth of the trench 5 in the surface region of the semiconductor substrate 1) and W (nm) be the width of the recess portion on the surface (in this embodiment, the width of the silicon nitride film 3 on the surface). A void is formed in a recess portion that satisfies conditions W≦100 nm and D/W≧4.5, as shown in FIG. 2. When a plurality of recess portions are present, and even one recess portion satisfies the conditions, a void is formed. This embodiment has an effect to avoid such a defect.

In this embodiment, the trench 5 is filled with a multi-layered structure which is obtained by sequentially forming a silicon oxide film by HDP-CVD and a silicon oxide film by SOG.

Figure 3:
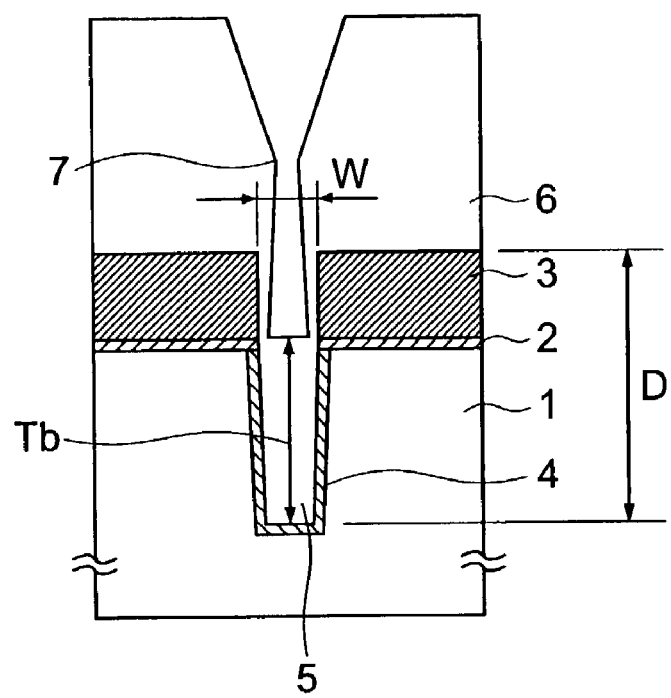
FIG. 3 is a longitudinal sectional view showing an element so as to explain steps in manufacturing a semiconductor device according to the first embodiment.

As shown in FIG. 3, a silicon oxide film 6 is formed to a position lower than the upper surface of the trench 5. Film formation is temporarily stopped before closing resultant overhangs 7.

When one trench 5 is present, the width of the trench 5 is defined as a minimum width Wmin. When a plurality of trenches 5 are present, the smallest one of the widths of the recess portions on the surface is defined as the minimum width Wmin. The thickness of the silicon oxide film 6 from the bottom surface in the trench 5 is defined as Tb.

When Tb/Wmin≧4.5 is satisfied, the overhangs 7 are closed to form a void. For this reason, the trench 5 cannot be filled with a silicon oxide film without forming any void in the next SOG process.

To prevent this, the silicon oxide film 6 is formed while controlling its thickness such that Tb/Wmin<4.5 is satisfied. With this process, the overhangs 7 are prevented from closing to form a void.

In this way, the trench 5 having a predetermined aspect ratio (D/W≧4.5) is formed. In forming the silicon oxide film 6, the thickness Tb of the silicon oxide film 6 in the trench 5 before closing the resultant overhangs 7 is measured in advance. During formation of the silicon oxide film 6, control is performed to stop film formation before the above thickness is obtained (Tb/Wmin<4.5).

Figure 4:
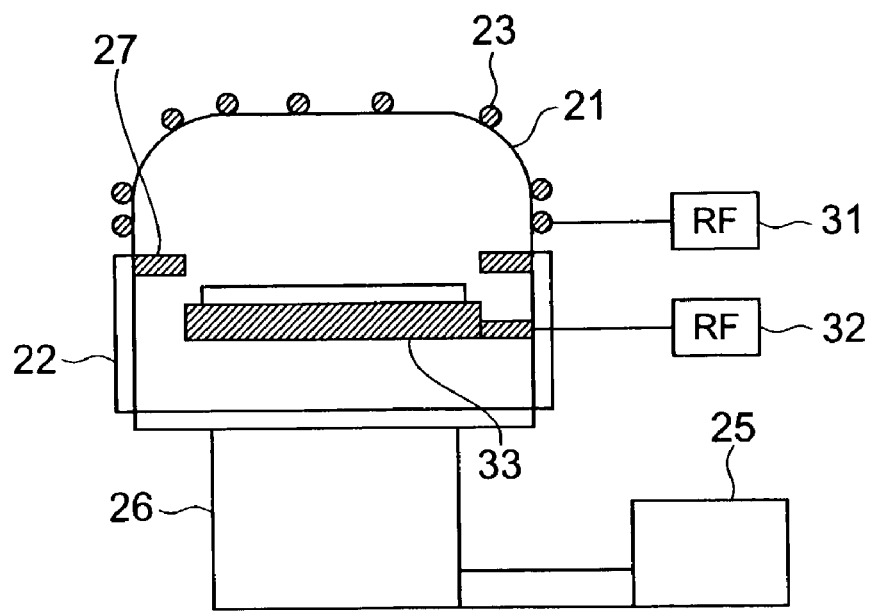
FIG. 4 is a longitudinal sectional view schematically showing the arrangement of an HDP-CVD apparatus.

FIG. 4 schematically shows the arrangement of an HDP-CVD apparatus. A reaction vessel is constituted by a ceramic dome portion 21 and metal chamber portion 22. An antenna 23 is wounded around the ceramic dome portion 21. The terminals of the antenna 23 are connected to an RF power supply 31 and ground terminal. RF power generated by the RF power supply 31 is applied to the antenna 23 whereby the power is supplied to the space in the ceramic dome portion 21 by inductive coupling to generate a plasma.

A dry pump 25 and turbo molecular pump 26 are connected to the metal chamber portion 22 so that the reaction vessel can be evacuated. A nozzle 27 serving as a gas supply portion is arranged. Hence, $SiH_4$ and $O_2$ gases can be supplied into the reaction vessel. An RF power supply 32 is connected to an electrode 33 so that a self-bias voltage can be applied.

$SiH_4$ and $O_2$ gases are supplied from the nozzle 27 into the reaction vessel. An RF voltage is applied by the RF power supply 31. In addition, an RF voltage is applied by the RF power supply 32 connected to the substrate electrode 33 to excite a plasma. Using this apparatus, the silicon oxide film 6 having a thickness of, e.g., about 300 nm is formed in the trench 5 by HDP-CVD.

When a film is formed by HDP-CVD, the film formation rate on the bottom surface of the trench 5 is higher than that on the side wall of the trench 5. In addition, the filling shape at the upper portion of the trench 5 (a portion on the upper side of the overhangs 7) is tapered, as shown in FIG. 3. Hence, the aspect ratio of the trench 5 acts in a direction of relaxing. However, since the overhangs 7 are present on the side wall of the trench 5, it is difficult to fill the trench 5 continuously by HDP-CVD without forming any void.

Figure 5:
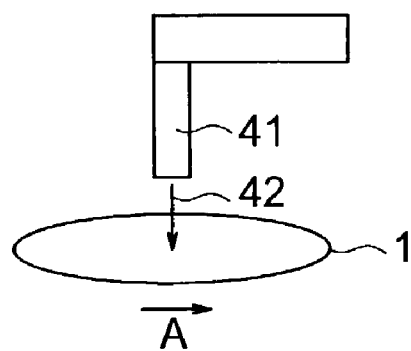
FIG. 5 is a perspective view showing SOG.
Figure 6:
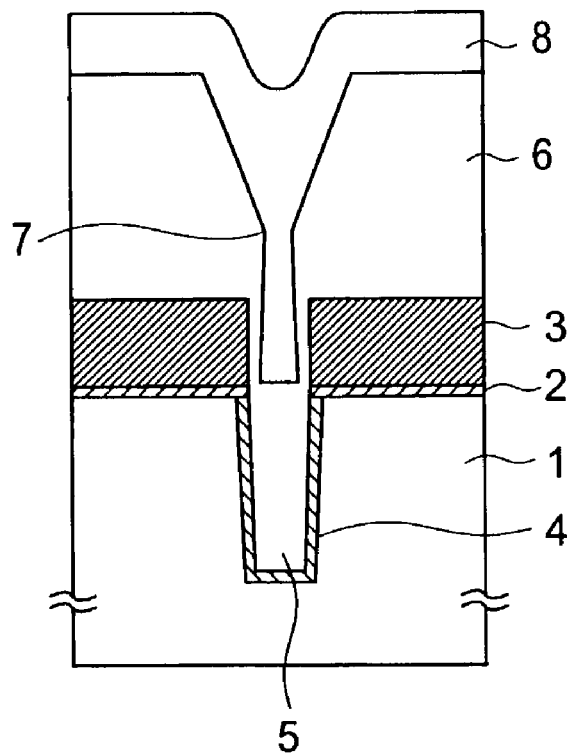
FIG. 6 is a longitudinal sectional view showing an element so as to explain steps in manufacturing a semiconductor device according to the first embodiment.

In the next step, a silicon oxide film 8 is formed by SOG. As shown in FIG. 5, in SOG, a chemical solution 42 in which a silicon oxide film material is melted is supplied from a nozzle 41, applied to the semiconductor substrate 1 while rotating it, and sintered. As a characteristic feature of the filling characteristic in forming a film by SOG, even the trench 5 with the overhangs 7 can be filled without forming any void or seam, as shown in FIG. 6.

In the step of forming the silicon oxide film 8 by SOG, a liquid containing polysilazane "—(SiH$_2$NH)—" may be applied by SOG, and the solvent may be evaporated by heating in an atmosphere containing O$_2$ or H$_2$O to form the silicon oxide film 8. In this case, the silicon oxide film 8 with a high quality can be obtained, and stress can be relaxed.

When the silicon oxide film 8 is formed by this method, the etching rate ratio with respect to a silicon oxide film formed by thermal oxidation can be made low in wet etching using a solution containing HF. When a liquid containing polysilazane is applied by SOG, and then, heating is executed in an atmosphere containing O$_2$ or H$_2$O at, e.g., about 700° C., the etching rate ratio with respect to a thermal oxide film is about 1.3 to 1.7. This value almost equals the etching rate ratio of the silicon oxide film 6 by HDP-CVD.

When the silicon oxide films 8 and 6 are etched using a solution containing HF after planarization by CMP and etching of the silicon nitride film 3 (to be described later), the etching rates of the two films equal each other. For this reason, a three-dimensional pattern on the surfaces of the silicon oxide films 8 and 6 after planarization can be minimized. To the contrary, when a siloxane-based solution is applied in forming the silicon oxide film 8 by SOG, the wet etching rate ratio becomes high. For this reason, the etching rate ratio of the silicon oxide film 8 largely differs from that of the silicon oxide film 6 by HDP-CVD. Hence, the three-dimensional pattern after planarization tends to be large.

As described above, in this embodiment, before the silicon oxide film 8 is formed by SOG, the silicon oxide film 6 is formed by HDP-CVD. Hence, the aspect ratio of the trench 5 is low. With this process, film sintering can be sufficiently executed, though it poses a problem in filling a trench having a high aspect ratio with a silicon oxide film by SOG. For this reason, the impurity content in the film can be reduced.

In addition, since the filling volume in the trench 5, which is occupied by the silicon oxide film 8 by SOG, is small, stress due to shrinkage during sintering can be reduced, and film peeling from the side wall of the trench 5 can be prevented.

Figure 15F:
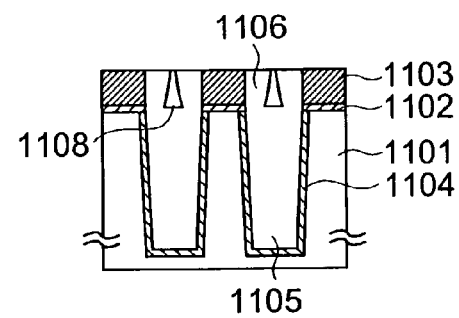
Figure 15G:
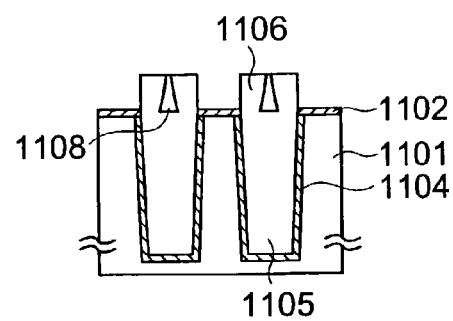
Figure 15H:
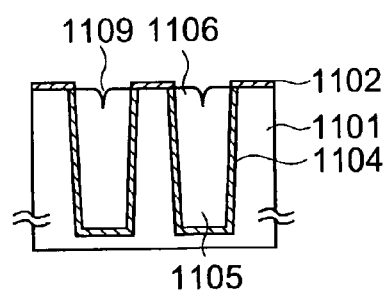

As shown in FIG. 6, after the silicon oxide film 8 is formed, the resultant structure is planarized to the thickness of the silicon nitride film 3 using CMP in accordance with the same procedure as that described with reference to FIGS. 15F to 15H. The silicon nitride film 3 is removed by etching. Finally, the silicon oxide films 8 and 6 that project from the surface of the semiconductor substrate 1 are removed by etching.

According to the above embodiment, the trench or a recess portion between interconnection layers or between electrodes formed in the surface region of the semiconductor substrate can be filled, without forming any void or seam, by stacking a silicon oxide film by HDP-CVD and a silicon oxide film by SOG. This can contribute to an increase in yield.

Especially, when the silicon oxide film 6 formed by HDP-CVD is buried in the trench 5 up to a position on the upper side of the upper surface of the semiconductor substrate 1 and on the lower side of the upper surface of the silicon nitride film 3, a structure having only the high-quality silicon oxide film 6 in the trench 5 can be finally obtained by removing the silicon oxide films 8 and 6 that project from the surface of the semiconductor substrate 1. Hence, a more excellent element isolation resistance can be realized.

In this embodiment, the film that comes into direct contact with the inner wall of the trench 5 is not the silicon oxide film 8 by SOG but the silicon oxide film 6 by HDP-CVD. As compared to a case wherein the film that comes into direct contact with the inner wall of the trench 5 is the silicon oxide film 8 by SOG, the impurity content in the silicon oxide film 6 by HDP-CVD contains can be regarded smaller. This is preferable in terms of reliability.

(2) SECOND EMBODIMENT

In the first embodiment, after the silicon oxide film 6 is formed by HDP-CVD, the silicon oxide film 8 is formed by SOG. In the second embodiment, the order of silicon oxide films is reversed. After a silicon oxide film is formed by SOG, a silicon oxide film is formed by HDP-CVD.

Figure 7A:
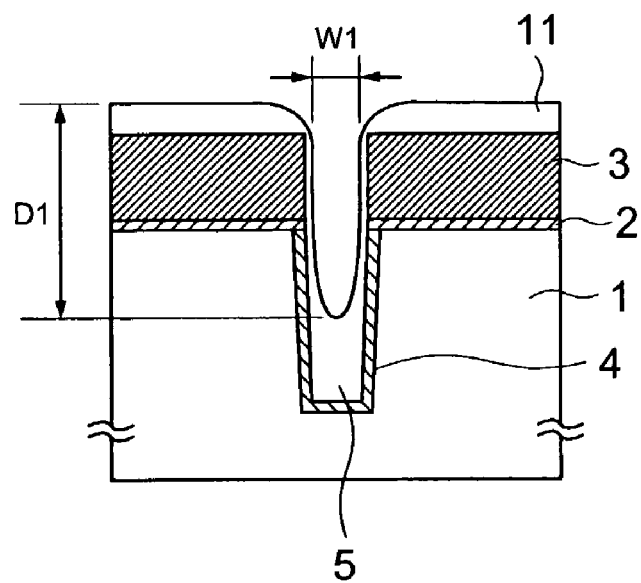
FIGS. 7A and 7B are longitudinal sectional views showing an element so as to explain steps in manufacturing a semiconductor device according to the second embodiment of the present invention.

As shown in FIG. 7A, a silicon oxide film 11 is formed by SOG halfway in an element isolation trench 5. As in the first embodiment, when the depth of the trench 5 is, e.g., about 300 nm, and the thickness of a silicon nitride film 3 is about 150 nm, the silicon oxide film 11 is formed such that its thickness from the bottom surface of the trench 5 becomes about 200 nm.

In the step of forming the silicon oxide film 11 by SOG, for example, a liquid containing polysilazane may be applied by SOG, and the solvent may be evaporated by heating in an atmosphere containing O$_2$ or H$_2$O to form the silicon oxide film 11, as in the first embodiment.

As described above, when the silicon oxide film 11 is formed in this way, the silicon oxide film 11 with high quality can be obtained, and stress can be relaxed.

When the silicon oxide film 11 is formed by this method, the etching rate ratio with respect to a silicon oxide film formed by thermal oxidation can be made low in wet etching using a solution containing HF. When a liquid containing polysilazane is applied by SOG, and then, heating is executed in an atmosphere containing O$_2$ or H$_2$O at, e.g., about 700° C., the etching rate ratio with respect to a thermal oxide film is about 1.3 to 1.7. This value almost equals the etching rate ratio of a silicon oxide film 12 to be formed after this by HDP-CVD.

When the silicon oxide films 11 and 12 are etched using a solution containing HF after planarization by CMP and etching of the silicon nitride film 3 (to be described later), the etching rates of the two films equal each other. For this reason, a three-dimensional pattern on the surfaces of the silicon oxide films 11 and 12 after planarization can be minimized. To the contrary, when a siloxane-based solution is applied in forming the silicon oxide film 11 by SOG, the wet etching rate ratio becomes high. For this reason, the etching rate ratio of the silicon oxide film 11 largely differs from that of the silicon oxide film 12 by HDP-CVD. Hence, the three-dimensional pattern after planarization tends to be large.

According to this embodiment, since the silicon oxide film 11 is formed halfway in the trench 5, the silicon oxide film 11 by SOG can be sufficiently sintered. For this reason, the impurity content in the film can be reduced. In addition, since the filling volume in the trench 5 is reduced, stress due to shrinkage during sintering also becomes small. Hence, film peeling can be prevented.

Figure 7B:
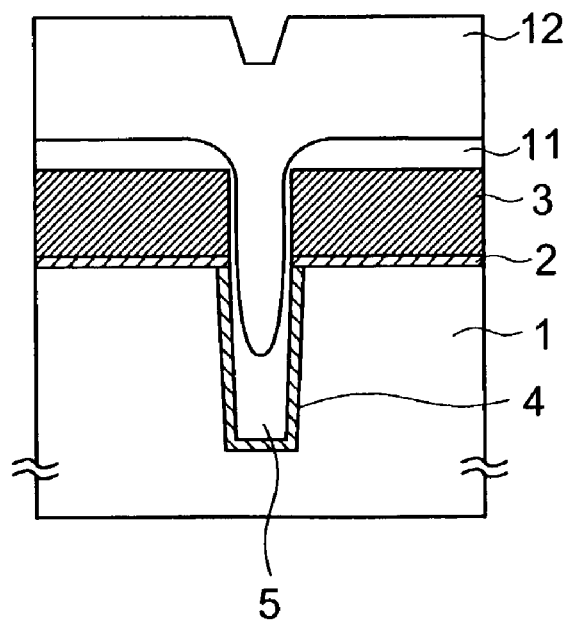

At this stage, although the silicon oxide film 11 is formed on the bottom surface of the trench 5, the silicon oxide film 11 is rarely formed on the side wall of the trench 5. Hence, the aspect ratio of the trench 5 is low. After this, the silicon oxide film 12 is formed by HDP-CVD, as shown in FIG. 7B, the trench 5 can be filled without forming any void or seam.

At the stage shown in FIG. 1 before formation of the silicon oxide film 11, let D (nm) be the depth of the trench 5 and W (nm) be the width of the trench 5 on the surface (the surface of the silicon nitride film 3).

Assume that conditions $W \leq 100$ nm and $D/W \geq 4.5$ are satisfied. When one trench 5 is present, the trench 5 satisfies the conditions. When a plurality of trenches 5 are present, a trench whose surface width is smallest satisfies the conditions.

When the silicon oxide film 11 is formed by SOG, the longitudinal sectional shape of the trench 5 is not reverse-tapered but forward-tapered. Hence, avoid is hardly formed. In addition, in a single trench 5 or one of a plurality of trenches 5, which has the smallest surface width, let D1 be the depth and W1 be the surface width of the recess portion after formation of the silicon oxide film 11. When the silicon oxide film 11 is formed to such a thickness that $D1/W1 < 4.5$ is satisfied, the aspect ratio becomes lower after formation than before formation. After that, when the silicon oxide film 12 is formed by HDP-CVD, the trench can be filled without forming any void or seam.

In this embodiment, the silicon oxide film 11 by SOG is buried such that its thickness from the bottom surface of the trench 5 becomes about 200 nm. However, the silicon oxide film 11 with a different thickness may be buried.

Figure 8A:
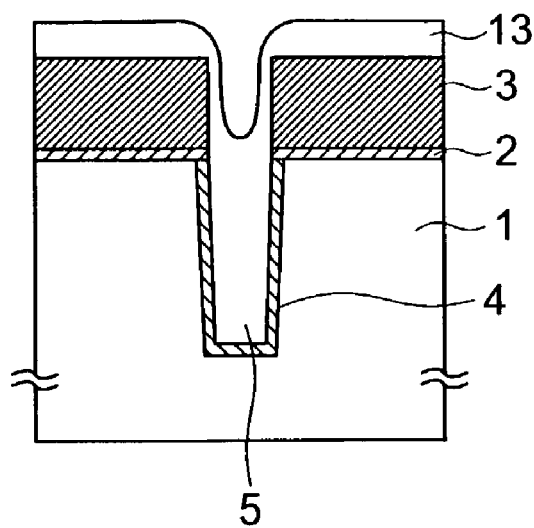
FIGS. 8A and 8B are longitudinal sectional views showing an element so as to explain steps in manufacturing a semiconductor device according to the second embodiment when the filling depth for the first time is different.

For example, as shown in FIG. 8A, a silicon oxide film 13 is formed by SOG halfway in the element isolation trench 5. In this case, when the depth of the trench 5 is about 300 nm, and the thickness of the silicon nitride film 3 is about 150 nm, the silicon oxide film 13 is formed such that its thickness from the bottom surface of the trench 5 becomes about 300 nm. That is, the silicon oxide film 13 is formed to a thickness substantially equal to the depth of the trench 5 in the semiconductor substrate 1, as shown in FIG. 8A. Film formation is stopped while leaving a recess portion having a depth corresponding to the thickness of the silicon nitride film 3.

As described above, since the film is formed halfway in the trench 5 which has a depth of about 450 nm as a whole, the silicon oxide film 13 by SOG can be sufficiently sintered. For this reason, the impurity content in the film can be reduced. In addition, since film formation is stopped halfway before the trench 5 is completely filled, the filling volume becomes small. Stress due to shrinkage during sintering also becomes small. Hence, film peeling can be prevented.

Figure 8B:
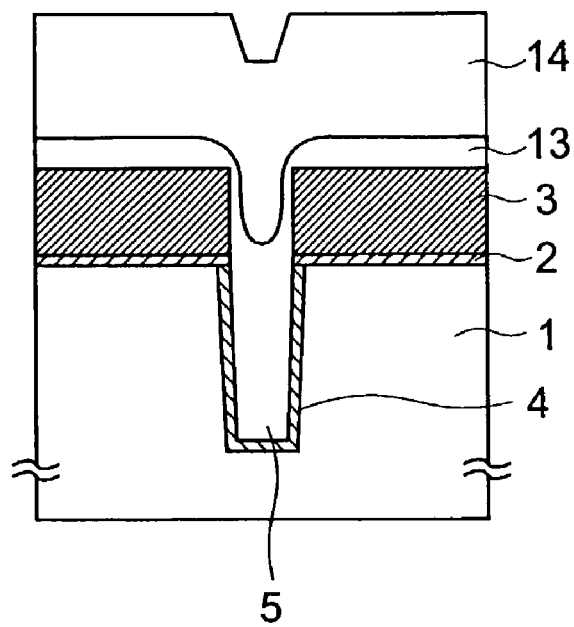

At this stage, the silicon oxide film 13 is formed on the bottom surface of the trench 5 to a thickness almost equal to the depth of the trench in the substrate 1. Since only a recess portion having a depth corresponding to the thickness of the silicon nitride film 3 remains, the aspect ratio of the trench 5 is low. After that, a silicon oxide film 14 is formed by HDP-CVD, as shown in FIG. 8B, thereby filling the trench 5 without forming any void or seam.

In the first and second embodiments, an element isolation trench formed in a surface region of a semiconductor substrate is filled with an insulating film. However, in the third and fourth embodiments of the present invention to be described below, the present invention is applied to fill a recess portion between electrodes with an interlayer dielectric film. In the fifth to eighth embodiments of the present invention, the present invention is applied to form an interlayer dielectric film on a semiconductor substrate and fill a portion between interconnection layers formed on that interlayer dielectric film as a conductive film pattern with another interlayer dielectric film.

(3) THIRD EMBODIMENT

A method for manufacturing a semiconductor device according to the third embodiment of the present invention will be described with reference to FIGS. 9A to 9C. This embodiment corresponds to a case wherein a recess portion between electrodes formed on a semiconductor substrate is filled with an interlayer dielectric film.

Figure 9C:
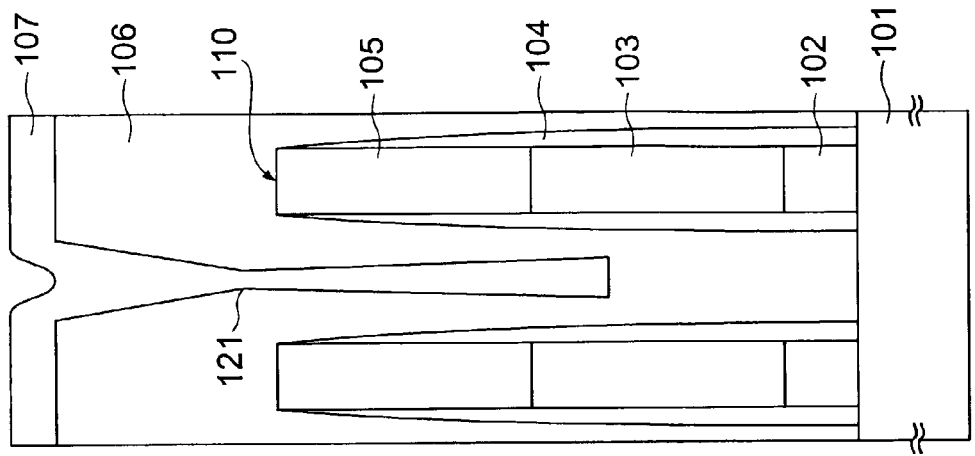
FIGS. 9A to 9C are longitudinal sectional views showing an element so as to explain steps in manufacturing a semiconductor device according to the third embodiment of the present invention.
Figure 9B:
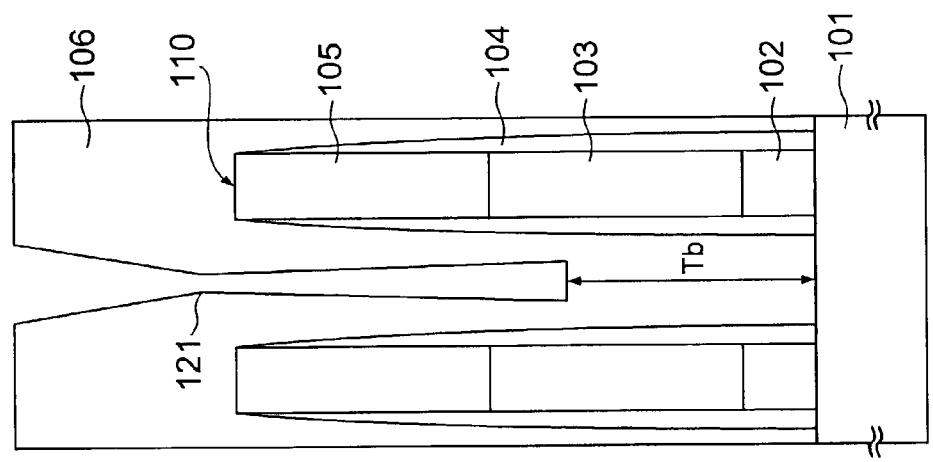
Figure 9A:
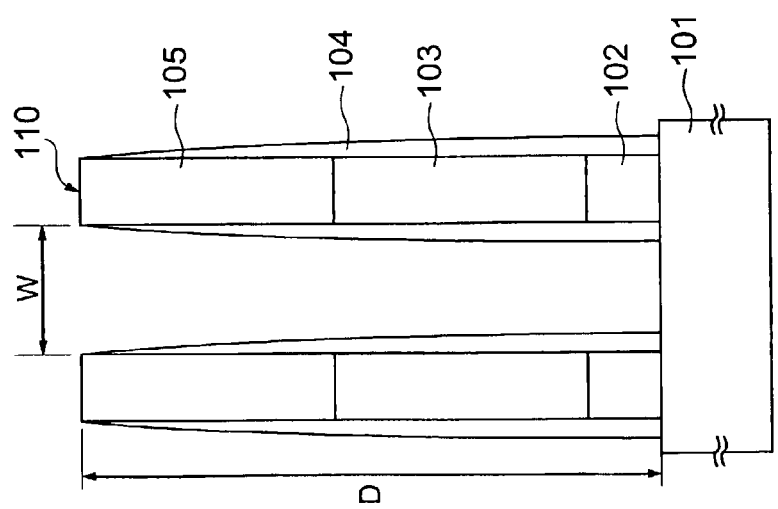

As shown in FIG. 9A, an insulating film 102 made of a silicon oxide film or the like is formed on the surface of a semiconductor substrate 101. A polysilicon film 103 and silicon nitride film 105 are formed on the insulating film 102. The resultant structure is patterned to form a plurality of electrodes 110. A silicon nitride film is deposited and etched back such that it remains on the side surfaces of each electrode 110, thereby forming side walls 104.

As shown in FIG. 9B, a silicon oxide film 106 is formed by HDP-CVD to fill a portion between the electrodes 110. In forming the silicon oxide film 106, film formation is stopped halfway in the trench between the electrodes 110 before closing resultant overhangs 121, as in the first embodiment.

In this embodiment, film formation may be controlled in the same manner as in the first embodiment. Let D (nm) be the depth of the trench between the electrodes 110 (in this embodiment, the thickness of the insulating film 102+ the thickness of the polysilicon film 103+ the thickness of the silicon nitride film 105) and W (nm) be the width of the trench on the surface (in this embodiment, the width of the silicon nitride film 105 on the surface). Assume that conditions $W \leq 100$ nm and $D/W \geq 4.5$ are satisfied. When a plurality of trenches are present, one of the plurality of trenches, which has the smallest surface width, satisfies the conditions.

As described above, the silicon oxide film 106 is formed to a position lower than the upper surface of the trench. Film formation is temporarily stopped before closing the resultant overhangs 121. When one trench is present, the width of the trench is defined as a minimum width Wmin. When a plurality of trenches are present, the smallest one of the widths of the trenches on the surface is defined as the minimum width Wmin. The thickness of the silicon oxide film 106 from the bottom surface in the trench (the surface of the semiconductor substrate 101) is defined as Tb. The silicon oxide film 106 is formed while controlling its thickness such that $Tb/Wmin < 4.5$ is satisfied. With this process, the overhangs 121 can be prevented from closing to form a void.

As shown in FIG. 9C, a silicon oxide film 107 is formed by SOG on the silicon oxide film 106. After that, planarization is executed by CMP.

In this embodiment, even when the overhangs 121 are present in the silicon oxide film 106, the trench can be filled without forming any void or seam, as in the first embodiment.

(4) FOURTH EMBODIMENT

A method for manufacturing a semiconductor device according to the fourth embodiment of the present invention will be described with reference to FIGS. 10A and 10B. In this embodiment, a recess portion between electrodes formed on a semiconductor substrate is filled by forming silicon oxide films in an order reverse to that in the third embodiment.

As in the third embodiment, a plurality of insulating films 102 and electrodes 110 are formed on the surface of a semiconductor substrate 101. Side walls 104 are formed on the side surfaces of the electrodes 110.

As shown in FIG. 10A, a silicon oxide film 111 is formed by SOG to fill a portion between the electrodes 110. This silicon oxide film 111 is formed halfway in the trench between the electrodes 110.

In this embodiment, formation of the silicon oxide film 111 may be controlled in the same manner as in the second embodiment. At the stage shown in FIG. 9A before formation of the silicon oxide film 111, let D (nm) be the depth of the trench and W (nm) be the width of the trench on the surface. Assume that conditions $W \leq 100$ nm and $D/W \geq 4.5$ are satisfied. When one trench is present, the trench satisfies the conditions. When a plurality of trenches are present, a trench which has the smallest surface width satisfies the conditions.

When the silicon oxide film 111 is formed by SOG, the longitudinal sectional shape of the trench is not reverse-tapered but forward-tapered. Hence, a void is hardly formed. In addition, in a single trench or one of a plurality of trenches, which has the smallest surface width, let D1 be the depth and W1 be the surface width of the recess portion after formation of the silicon oxide film 111. When the silicon oxide film 111 is formed to such a thickness that $D1/W1<4.5$ is satisfied, the aspect ratio becomes lower after formation of the silicon oxide film 111 than before formation.

As shown in FIG. 10B, a silicon oxide film 112 is formed by HDP-CVD on the silicon oxide film 111. After that, planarization is executed by CMP.

In this embodiment, the trench can be filled without forming any void or seam, as in the second embodiment.

(5) FIFTH EMBODIMENT

A method for manufacturing a semiconductor device according to the fifth embodiment of the present invention will be described with reference to FIGS. 11A to 11C. This embodiment corresponds to a case wherein an interlayer dielectric film is formed on a semiconductor substrate, and a portion between interconnection layers formed on the interlayer dielectric film as a conductive film pattern is filled with another interlayer dielectric film.

Figure 11C:
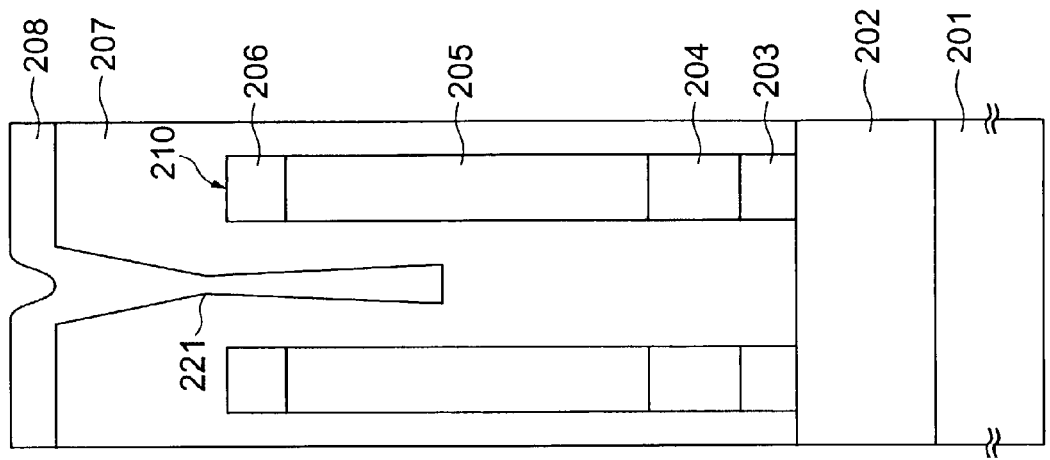
FIGS. 11A to 11C are longitudinal sectional views showing an element so as to explain steps in manufacturing a semiconductor device according to the fifth embodiment of the present invention.
Figure 11B:
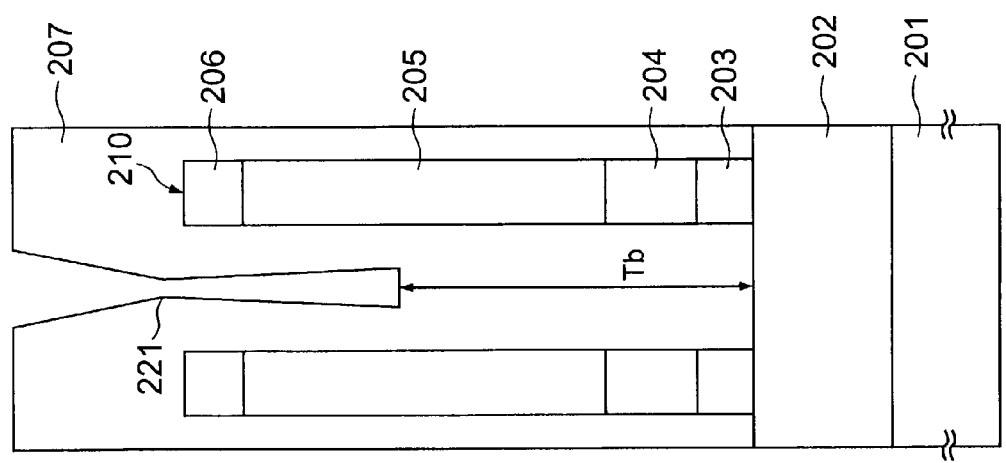
Figure 11A:
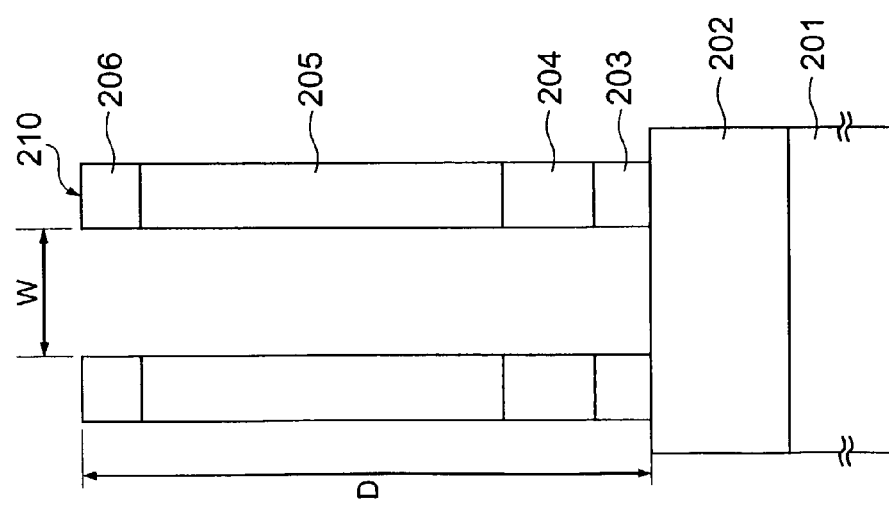

As shown in FIG. 11A, an interlayer dielectric film 202 made of a silicon oxide film or the like is formed on the surface of a semiconductor substrate 201. Electrodes and contacts formed on the semiconductor substrate 201 are not illustrated.

A titanium film 203, titanium nitride film 204, aluminum film 205, and titanium nitride film 206 are formed on the interlayer dielectric film 202 and patterned to form a plurality of interconnection layers 210.

As shown in FIG. 11B, a silicon oxide film 207 is formed by HDP-CVD to fill a portion between the interconnection layers 210. In forming the silicon oxide film 207, film formation is stopped halfway in the trench between the interconnection layers 210 before closing resultant overhangs 221, as in the first and third embodiments.

Even in this embodiment, film formation may be controlled in the same manner as in the first and third embodiments. Let D (nm) be the depth of the trench between the interconnection layers 210 (in this embodiment, the thickness of the titanium film 203+ the thickness of the titanium nitride film 204+ the thickness of the aluminum film 205+ the thickness of the titanium nitride film 206) and W (nm) be the width of the trench on the surface (in this embodiment, the width of the titanium nitride film 206 on the surface). Assume that conditions $W \leq 100$ nm and $D/W \geq 4.5$ are satisfied. When a plurality of trenches are present, one of the plurality of trenches, which has the smallest surface width, satisfies the conditions.

As described above, the silicon oxide film 207 is formed to a position lower than the upper surface of the trench. Film formation is temporarily stopped before closing the resultant overhangs 221. When one trench is present, the width of the trench is defined as a minimum width Wmin. When a plurality of trenches are present, the smallest one of the widths of the trenches on the surface is defined as the minimum width Wmin. The thickness of the silicon oxide film 207 from the bottom surface in the trench (the surface of the interlayer dielectric film 202) is defined as Tb. The silicon oxide film 207 is formed while controlling its thickness such that Tb/Wmin< 4.5 is satisfied. With this process, the overhangs 221 can be prevented from closing to form a void.

As shown in FIG. 11C, a silicon oxide film 208 is formed by SOG on the silicon oxide film 207. After that, planarization is executed by CMP.

In this embodiment, even when the overhangs 221 are present in the silicon oxide film 207, the trench can be filled without forming any void or seam, as in the first and third embodiments.

(6) SIXTH EMBODIMENT

A method for manufacturing a semiconductor device according to the sixth embodiment of the present invention will be described with reference to FIGS. 12A and 12B. In this embodiment, a recess portion between interconnection layers formed on a semiconductor substrate is filled by forming silicon oxide films in an order reverse to that in the fifth embodiment.

Figure 12A:
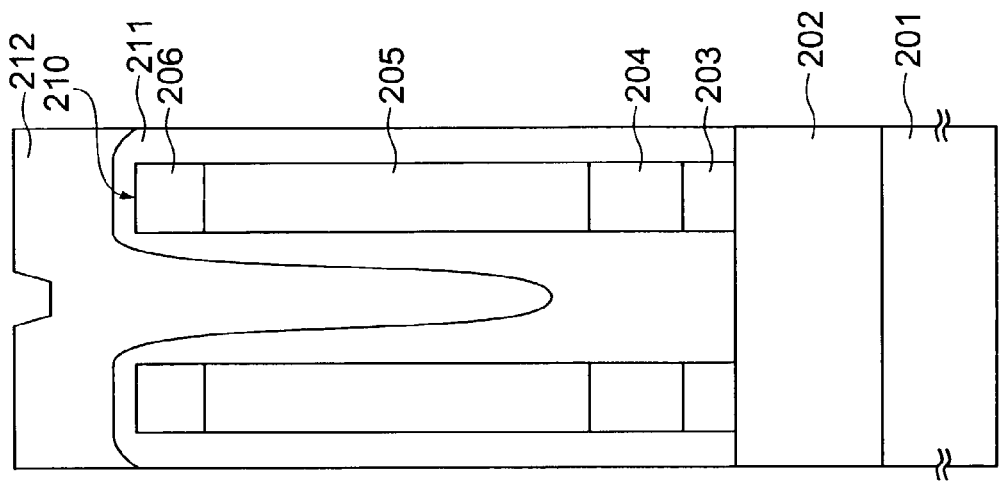
FIGS. 12A and 12B are longitudinal sectional views showing an element so as to explain steps in manufacturing a semiconductor device according to the sixth embodiment of the present invention.

As shown in FIG. 12A, as in the fifth embodiment, a titanium film 203, titanium nitride film 204, aluminum film 205, and titanium nitride film 206 are formed on an interlayer dielectric film 202 and patterned to form a plurality of interconnection layers 210. A silicon oxide film 211 is formed by SOG to fill a portion between the interconnection layers 210. This silicon oxide film 211 is formed halfway in the trench between the interconnection layers 210.

Even in this embodiment, formation of the silicon oxide film 211 may be controlled in the same manner as in the second and fourth embodiments. At the stage shown in FIG. 11A before formation of the silicon oxide film 211, let D (nm) be the depth of the trench and W (nm) be the width of the trench on the surface. Assume that conditions $W \leq 100$ nm and $D/W \geq 4.5$ are satisfied. When one trench is present, the trench satisfies the conditions. When a plurality of trenches are present, a trench which has the smallest surface width satisfies the conditions.

When the silicon oxide film 211 is formed by SOG, the longitudinal sectional shape of the trench is not reverse-tapered but forward-tapered. Hence, a void is hardly formed. In addition, in a single trench or one of a plurality of trenches, which has the smallest surface width, let D1 be the depth and W1 be the surface width of the recess portion after formation of the silicon oxide film 211. When the silicon oxide film 211 is formed to such a thickness that $D1/W1<4.5$ is satisfied, the aspect ratio becomes lower after formation of the silicon oxide film 211 than before formation.

Figure 12B:
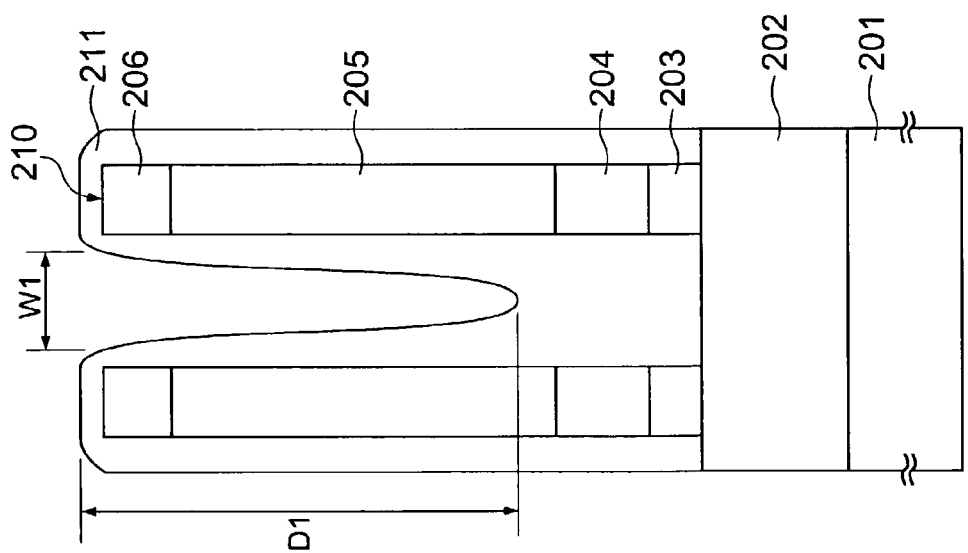

As shown in FIG. 12B, a silicon oxide film 212 is formed by HDP-CVD on the silicon oxide film 211. After that, planarization is executed by CMP.

In this embodiment, the trench can be filled without forming any void or seam, as in the second and fourth embodiments.

(7) SEVENTH EMBODIMENT

A method for manufacturing a semiconductor device according to the seventh embodiment of the present invention will be described with reference to FIGS. 13A to 13C. This embodiment corresponds to a case wherein an interlayer dielectric film is formed on a semiconductor substrate, and a portion between interconnection layers formed on the interlayer dielectric film as a conductive film pattern is filled with another interlayer dielectric film, as in the fifth embodiment.

Figure 13A:
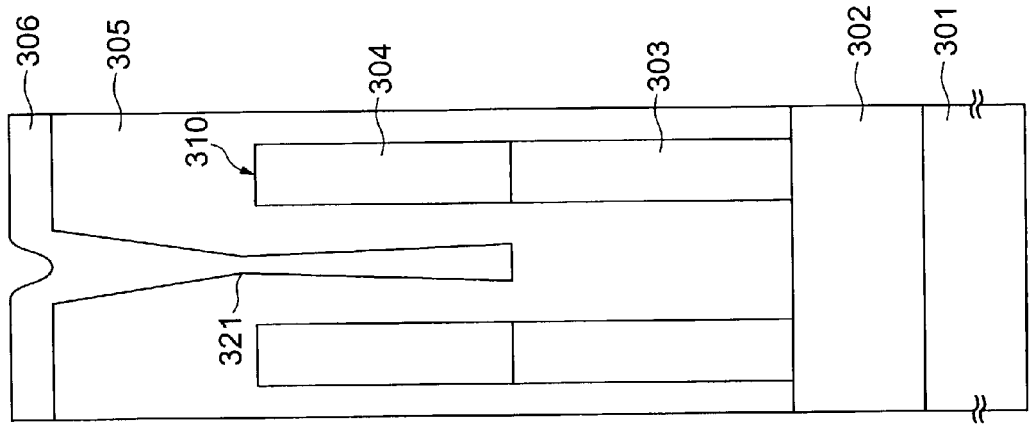
FIGS. 13A to 13C are longitudinal sectional views showing an element so as to explain steps in manufacturing a semiconductor device according to the seventh embodiment of the present invention.

As shown in FIG. 13A, an interlayer dielectric film 302 made of a silicon oxide film or the like is formed on the surface of a semiconductor substrate 301. Electrodes and contacts formed on the semiconductor substrate 301 are not illustrated.

A tungsten film 303 and silicon nitride film 304 are formed on the interlayer dielectric film 302 and patterned to form a plurality of interconnection layers 310.

Figure 13B:
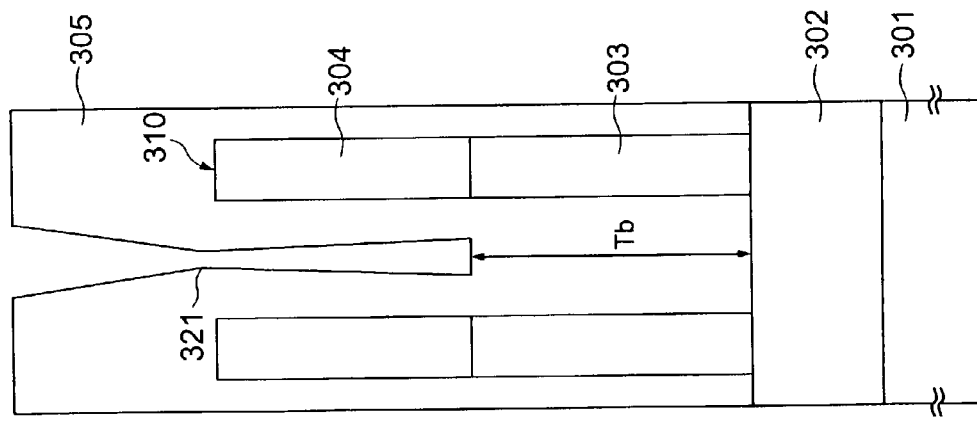

As shown in FIG. 13B, a silicon oxide film 305 is formed by HDP-CVD to fill a portion between the interconnection layers 310. In forming the silicon oxide film 305, film formation is stopped halfway in the trench between the interconnection layers 310 before closing resultant overhangs 321, as in the first, third, and fifth embodiments.

In this embodiment, film formation may be controlled in the same manner as in the first, third, and fifth embodiments. Let D (nm) be the depth of the trench between the interconnection layers 310 (in this embodiment, the thickness of the tungsten film 303+ the thickness of the silicon nitride film 304) and W (nm) be the width of the trench on the surface (in this embodiment, the width of the silicon nitride film 304 on the surface). Assume that conditions $W \leq 100$ nm and $D/W \geq 4.5$ are satisfied. When a plurality of trenches are present, one of the plurality of trenches, which has the smallest surface width, satisfies the conditions.

As described above, the silicon oxide film 305 is formed to a position lower than the upper surface of the trench. Film formation is temporarily stopped before closing the resultant overhangs 321. When one trench is present, the width of the trench is defined as a minimum width Wmin. When a plurality of trenches are present, the smallest one of the widths of the trenches on the surface is defined as the minimum width Wmin. The thickness of the silicon oxide film 305 from the bottom surface in the trench (the surface of the interlayer dielectric film 302) is defined as Tb. The silicon oxide film 305 is formed while controlling its thickness such that Tb/Wmin<4.5 is satisfied. With this process, the overhangs 321 can be prevented from closing to form a void.

Figure 13C:
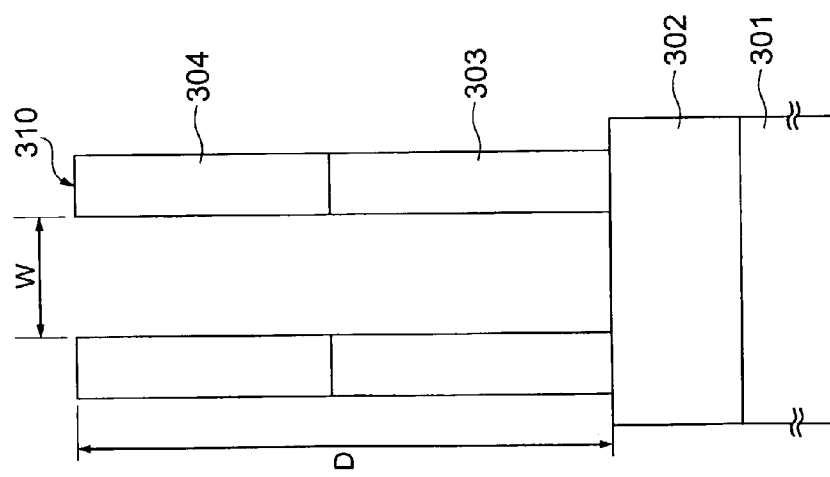

As shown in FIG. 13C, a silicon oxide film 306 is formed by SOG on the silicon oxide film 305. After that, planarization is executed by CMP.

In this embodiment, even when the overhangs 321 are present in the silicon oxide film 305, the trench can be filled without forming any void or seam, as in the first, third, and fifth embodiments.

(8) EIGHTH EMBODIMENT

A method for manufacturing a semiconductor device according to the eighth embodiment of the present invention will be described with reference to FIGS. 14A and 14B. In this embodiment, a recess portion between interconnection layers formed on a semiconductor substrate is filled by forming silicon oxide films in an order reverse to that in the seventh embodiment.

Figure 14A:
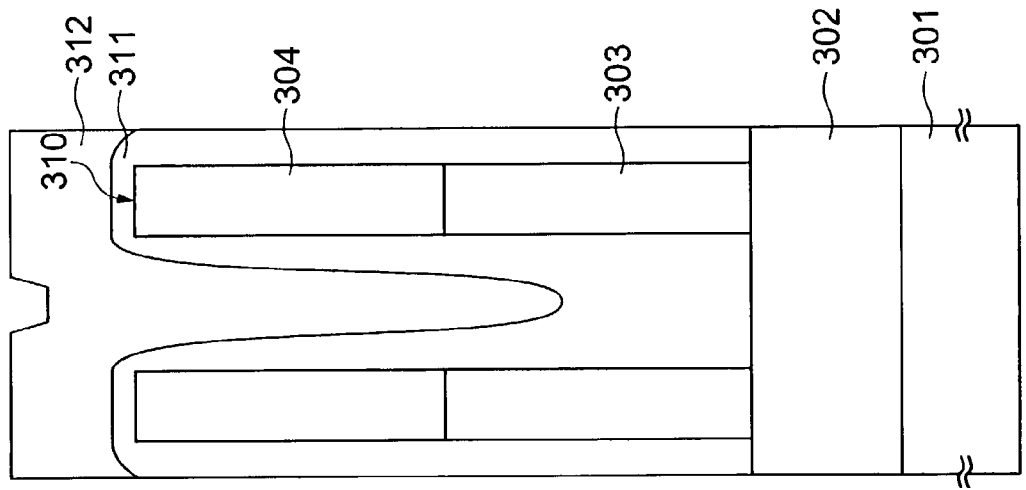
FIGS. 14A and 14B are longitudinal sectional views showing an element so as to explain steps in manufacturing a semiconductor device according to the eighth embodiment of the present invention.

As shown in FIG. 14A, as in the seventh embodiment, an interlayer dielectric film 302, tungsten film 303, and silicon nitride film 304 are formed on the surface of a semiconductor substrate 301 and patterned to form a plurality of interconnection layers 310. A silicon oxide film 311 is formed by SOG to fill a portion between the interconnection layers 310. This silicon oxide film 311 is formed halfway in the trench between the interconnection layers 310.

In this embodiment, formation of the silicon oxide film 311 may be controlled in the same manner as in the second, fourth, and sixth embodiments. At the stage shown in FIG. 13A before formation of the silicon oxide film 311, let D (nm) be the depth of the trench and W (nm) be the width of the trench on the surface. Assume that conditions $W \leq 100$ nm and $D/W \geq 4.5$ are satisfied. When one trench is present, the trench satisfies the conditions. When a plurality of trenches are present, a trench which has the smallest surface width satisfies the conditions.

When the silicon oxide film 311 is formed by SOG, the longitudinal sectional shape of the trench is not reverse-tapered but forward-tapered. Hence, a void is hardly formed. In addition, in a single trench or one of a plurality of trenches, which has the smallest surface width, let D1 be the depth and W1 be the surface width of the recess portion after formation of the silicon oxide film 311. When the silicon oxide film 311 is formed to such a thickness that D1/W1<4.5 is satisfied, the aspect ratio becomes lower after formation of the silicon oxide film 311 than before formation.

Figure 14B:
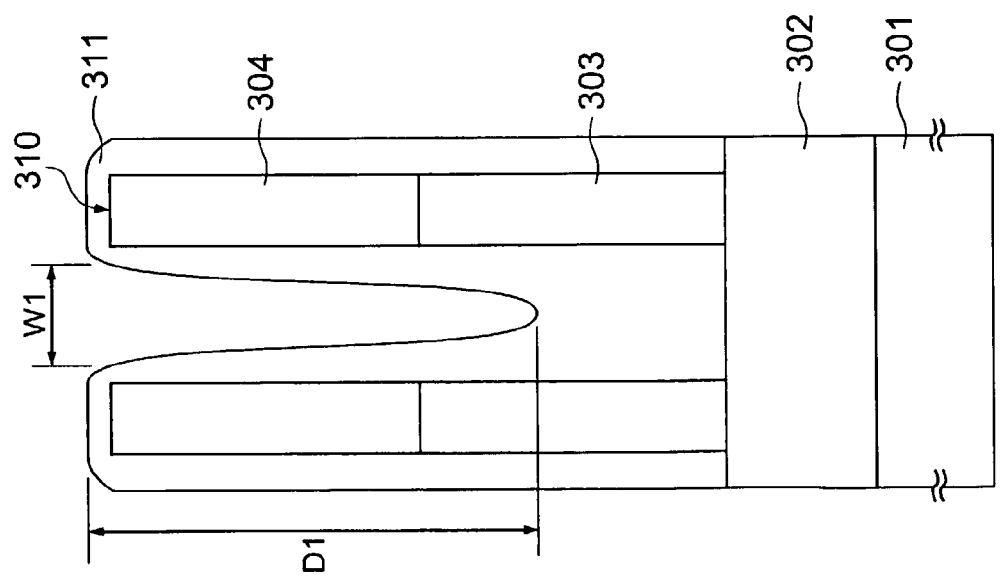

As shown in FIG. 14B, a silicon oxide film 312 is formed by HDP-CVD on the silicon oxide film 311. After that, planarization is executed by CMP.

In this embodiment, the trench can be filled without forming any void or seam, as in the second, fourth, and sixth embodiments.

As described in the first to eighth embodiments, the present invention can be widely applied to fill a trench or a portion between electrodes or between interconnection layers with an insulating film. Especially, the embodiments of the present invention is effective when a recess portion having a high aspect ratio, e.g., an aspect ratio of 4.5 or more is to be filled with an insulating film, as described above.

What is claimed is:

1. A method for manufacturing a semiconductor device, comprising:

forming a first silicon oxide film by high density plasma chemical vapor deposition (to be referred to as HDP-CVD hereinafter) so as to bury a recess portion in a three-dimensional portion formed in a surface region of a semiconductor workpiece to a position lower than an upper surface of the recess portion; and forming a second silicon oxide film by spin on glass (to be referred to as SOG hereinafter) on the first silicon oxide film so as to fill the recess portion;

wherein D (nm) is a depth of the recess portion in the three-dimensional portion and W (nm) is a width on the upper surface of the recess portion, and when one recess portion is present, the recess portion satisfies $W \leq 100$ nm and $D/W \geq 4.5$, and when a plurality of recess portions are present, at least one recess portion satisfies $W \leq 100$ nm and $D/W \geq 4.5$; and wherein Wmin is a width of one of the recess portions, which has the smallest width, Tb is a thickness of the first silicon oxide film on the bottom surface in the recess portion, and the first silicon oxide film is formed to a thickness that satisfies Tb/Wmin<4.5.

2. A method according to claim 1, wherein the three-dimensional portion has a step corresponding to a sum of a depth of a trench formed in a semiconductor substrate and a thickness of a trench forming mask film formed on the semiconductor substrate.

3. A method according to claim 2, wherein the first silicon oxide film is formed to a position lower than the upper surface of the recess portion and higher than an upper surface of the semiconductor substrate.

4. A method according to claim 1, wherein the forming the second silicon oxide film comprises applying a liquid containing polysilazane by SOG and heating the polysilazane in an atmosphere containing at least one of $O_2$ and $H_2O$.

5. A method according to claim 2, wherein the forming the second silicon oxide film comprises applying a liquid containing polysilazane by SOG and heating the polysilazane in an atmosphere containing at least one of $O_2$ and $H_2O$.

6. A method according to claim 5, further comprising, after forming the first and second silicon oxide films to fill the recess portion, etching the first and second silicon oxide films that project from a surface of the semiconductor substrate by removing the mask film.

7. A method according to claim 2, further comprising planarizing the first and second silicon oxide films so as to remove the first and second silicon oxide films formed on a protruding portion in the three-dimensional portion and selectively leave the first and second silicon oxide films in the recess portion.

8. A method according to claim 1, wherein the three-dimensional portion has a step corresponding to a thickness of a conductive film pattern formed above a semiconductor substrate.

9. A method according to claim 8, further comprising, after forming the first and second silicon oxide films to fill the recess portion, planarizing a surface of the second silicon oxide film.

10. A method for manufacturing a semiconductor device, comprising:
   forming a first silicon oxide film by SOG so as to bury a recess portion in a three-dimensional portion formed in a surface region of a semiconductor workpiece to a position lower than an upper surface of the recess portion; and
   forming a second silicon oxide film by HDP-CVD on the first silicon oxide film so as to fill the recess portion;
   wherein D (nm) is a depth of the recess portion in the three-dimensional portion and W (nm) is a width on the upper surface of the recess portion, and when one recess portion is present, the recess portion satisfies W≦100 nm and DAN≧4.5, and when a plurality of recess portions are present, at least one recess portion satisfies W≦100 nm and D/M≧4.5; and
   wherein W1 is a width of one of the recess portions, which has the smallest width, D1 is a depth of the recess portion after the first silicon oxide film is formed in the recess portion, and the first silicon oxide film is formed to a thickness that satisfies D1/W1<4.5.

11. A method according to claim 10, wherein the three-dimensional portion has a step corresponding to a sum of a depth of a trench formed in a semiconductor substrate and a thickness of a trench forming mask film formed on the semiconductor substrate.

12. A method according to claim 11, wherein the forming the first silicon oxide film comprises applying a liquid containing polysilazane by SOG and heating the polysilazane in an atmosphere containing at least one of $O_2$ and $H_2O$.

13. A method according to claim 12, further comprising, after forming the first and second silicon oxide films to fill the recess portion, etching the first and second silicon oxide films that project from a surface of the semiconductor substrate by removing the mask film.

14. A method according to claim 11, further comprising planarizing the first and second silicon oxide films so as to remove the first and second silicon oxide films formed on a protruding portion in the three-dimensional portion and selectively leave the first and second silicon oxide films in the recess portion.

15. A method according to claim 10, wherein the three-dimensional portion has a step corresponding to a thickness of a conductive film pattern formed above a semiconductor substrate.

16. A method according to claim 15, further comprising, after forming the first and second silicon oxide films to fill the recess portion, planarizing a surface of the second silicon oxide film.

* * * * *

UNITED STATES PATENT AND TRADEMARK OFFICE
CERTIFICATE OF CORRECTION

PATENT NO. : 7,052,971 B2
APPLICATION NO. : 10/193143
DATED : May 30, 2006
INVENTOR(S) : Nishiyama et al.

It is certified that error appears in the above-identified patent and that said Letters Patent is hereby corrected as shown below:

Claim 10, column 14, line 7, change "DAN $\geqq 4.5$," to --D/W $\geqq 4.5$,--.

Claim 10, column 14, line 9, change "D/M $\geqq 4.5$," to --D/W $\geqq 4.5$,--.

Signed and Sealed this

Fifth Day of December, 2006

JON W. DUDAS
*Director of the United States Patent and Trademark Office*